United States Patent
Huang et al.

(10) Patent No.: US 9,595,588 B1
(45) Date of Patent: Mar. 14, 2017

(54) SEMICONDUCTOR DEVICE WITH EMBEDDED CELL AND METHOD OF MANUFACTURING THE SAME

(71) Applicant: UNITED MICROELECTRONICS CORP., Hsinchu (TW)

(72) Inventors: Chun-Sung Huang, Changhua County (TW); Ko-Chi Chen, Taoyuan (TW); Shen-De Wang, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/069,331

(22) Filed: Mar. 14, 2016

(30) Foreign Application Priority Data

Jan. 27, 2016 (TW) .............................. 105102502 A

(51) Int. Cl.
*H01L 29/788* (2006.01)
*H01L 29/423* (2006.01)
*H01L 27/115* (2006.01)

(52) U.S. Cl.
CPC .. *H01L 29/42336* (2013.01); *H01L 27/11521* (2013.01)

(58) Field of Classification Search
None
See application file for complete search history.

(56) References Cited

U.S. PATENT DOCUMENTS

| | | | | |
|---|---|---|---|---|
| 4,975,384 A | * | 12/1990 | Baglee | G11C 16/0441 257/E21.209 |
| 4,979,004 A | * | 12/1990 | Esquivel | H01L 27/115 257/316 |
| 5,045,490 A | | 9/1991 | Esquivel et al. | |
| 5,315,142 A | * | 5/1994 | Acovic | G11C 16/12 257/316 |
| 5,338,953 A | * | 8/1994 | Wake | H01L 27/11517 257/316 |
| 5,411,905 A | * | 5/1995 | Acovic | H01L 21/28273 257/E21.209 |
| 5,567,635 A | * | 10/1996 | Acovic | G11C 16/12 257/E21.422 |
| 5,616,510 A | * | 4/1997 | Wong | G11C 11/5621 257/E21.693 |
| 5,907,775 A | * | 5/1999 | Tseng | H01L 29/66825 257/E21.209 |
| 5,923,063 A | * | 7/1999 | Liu | H01L 27/115 257/314 |

(Continued)

*Primary Examiner* — Thao P Le
(74) *Attorney, Agent, or Firm* — WPAT, PC; Justin King

(57) ABSTRACT

A semiconductor device with embedded cell is provided. A silicon substrate has a first area with at least one first cell and a second area with at least one second cell. The first cell is positioned in the first area and formed in a trench of the silicon substrate, and the second cell is positioned in the second area and formed on the silicon substrate. The first cell includes a first dielectric layer formed on sidewalls and a bottom of the trench, a floating gate formed on the first dielectric layer and embedded in the trench, a second dielectric layer formed on the floating gate and embedded in the trench, and a control gate formed on the second dielectric layer and embedded in the trench, wherein the control gate is separated from the floating gate by the second dielectric layer.

16 Claims, 6 Drawing Sheets

(56) References Cited

U.S. PATENT DOCUMENTS

| | | | |
|---|---|---|---|
| 6,344,393 B1* | 2/2002 | Liu | H01L 21/28273 |
| | | | 257/315 |
| 6,770,934 B1* | 8/2004 | Hung | H01L 21/28273 |
| | | | 257/315 |
| 7,883,966 B2* | 2/2011 | Kim | H01L 21/823807 |
| | | | 257/315 |
| 2008/0067572 A1* | 3/2008 | Mokhlesi | H01L 27/115 |
| | | | 257/315 |

* cited by examiner

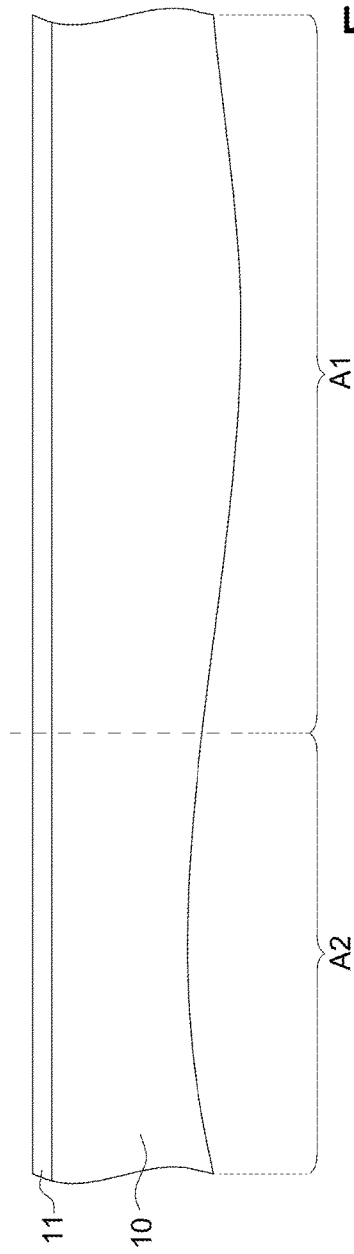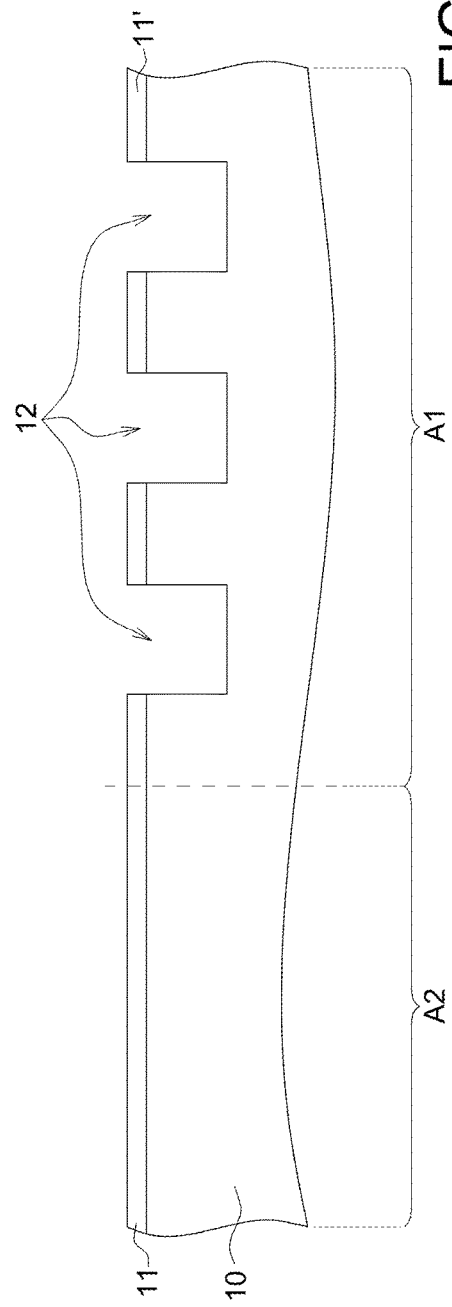

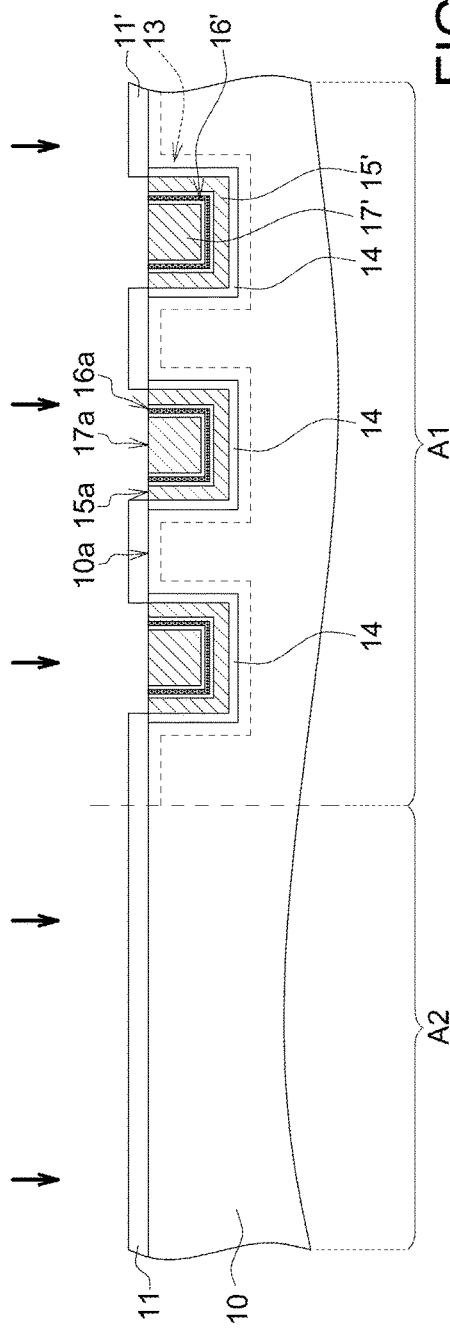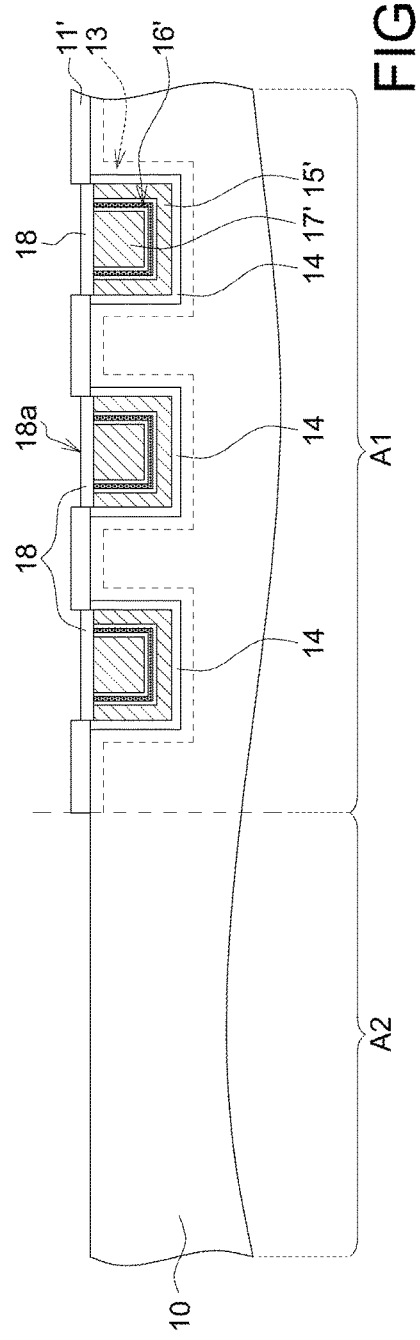

SEMICONDUCTOR DEVICE WITH EMBEDDED CELL AND METHOD OF MANUFACTURING THE SAME

This application claims the benefit of Taiwan application Serial No. 105102502, filed Jan. 27, 2016, the subject matter of which is incorporated herein by reference.

BACKGROUND

Technical Field

The disclosure relates in general to a semiconductor device and a method of manufacturing the same, and more particularly to a semiconductor device with embedded cell and a method of manufacturing the same.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical performance, would be one of the important issues of the device for the manufacturers. Generally, a semiconductor device with good electrical performance requires the elements with complete profiles.

According to the typical manufacturing method for forming the semiconductor devices such as the logic cells and the memory cells on the silicon substrate, the gate heights of the logic cells and the memory cells are different and the manufacturing process would cause damage to the gates (ex: control gates) of the memory cells. It is known that the elements (ex, control gates of the memory cells) of the semiconductor device with flawed profiles and insufficient gate height will cause considerable deterioration on the electrical properties of the devices.

SUMMARY

The disclosure is directed to a semiconductor device with embedded cell and a method of manufacturing the same, which effectively prevents the damages to the cell gates in the different regions of the substrate.

According to one aspect of the present disclosure, a semiconductor device is provided, comprising a silicon substrate having a first area and a second area; at least a first cell positioned in the first area and formed in a trench of the silicon substrate; and at least a second cell positioned in the second area and formed on the silicon substrate. The first cell includes a first dielectric layer formed on the sidewalls and a bottom of the trench; a floating gate formed on the first dielectric layer and embedded in the trench; a second dielectric layer formed on the floating gate and embedded in the trench; and a control gate formed on the second dielectric layer and embedded in the trench, wherein the control gate is separated from the floating gate by the second dielectric layer.

According to another aspect of the present disclosure, a method for manufacturing a semiconductor device is provided. A silicon substrate having a first area and a second area is provided. At least a first cell with the aforementioned structure is formed in the first area and embedded in a trench of the silicon substrate, and at least a second cell formed in the second area and positioned on the silicon substrate.

BRIEF DESCRIPTION OF THE DRAWINGS

FIG. 1A-FIG. 1G illustrate a method for manufacturing a semiconductor device according to one embodiment of the disclosure.

Figure 1C:
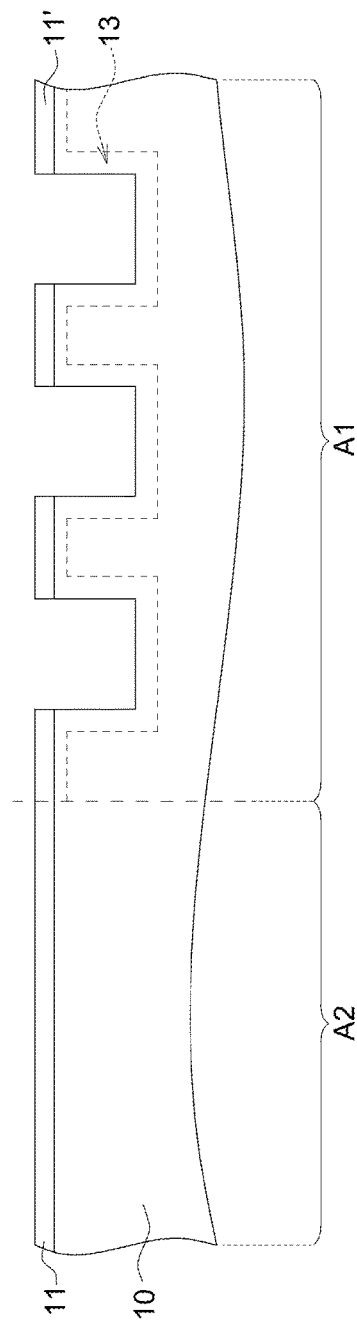

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiments of the present disclosure, a semiconductor device with embedded cell and a method of manufacturing the same are provided. The embodiments can be applied to manufacture a semiconductor device having no-damaged gates in the different regions. Embodiments are provided hereinafter with reference to the accompanying drawings for describing the related procedures and configurations. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In the embodiment, a semiconductor device having memory cells such as flash memory cells embedded in the substrate is disclosed. FIG. 1A-FIG. 1G illustrate a method for manufacturing a semiconductor device according to one embodiment of the disclosure. As shown in FIG. 1A, a substrate 10 (such as silicon substrate) having a first area A1 and a second area A2 is provided. A sacrificial oxide layer 11 is formed on the substrate 10. According to the embodiment, the first area A1 can be a flash area to form the flash memory cells subsequently for data storage, and the second area A2 can be a logic area to form the logic cells for logical operation. In practical application, a semiconductor device includes several flash memory cells, but FIG. 1A-FIG. 1G only schematically show three flash memory cells for the purpose of clear demonstration.

Afterward, the flash diffusion pattern (for bit line pattern) is defined, followed by trench formation. As shown in FIG. 1B, several trenches 12 are formed in the silicon substrate 10. A patterned sacrificial oxide layer 11' on the substrate 10 is formed in the first area A1, while the sacrificial oxide layer 11 in the second area A2 is deposited as a blanket layer. In one embodiment, the depths of the trenches 12 could be (but not limitedly) in the range of 1000 Å-2000 Å.

As shown in FIG. 1C, the regions near the trenches 12 are implanted to form an implantation region 13 by using one mask. In one embodiment, boron ions can be (but not limited to) implanted to form the implantation region 13 with a dosage of about $5E13/cm^2$. The threshold voltage (Vt) of the memory cells subsequently formed in the first area A1 can be adjusted by this implantation region 13.

Figure 1D:
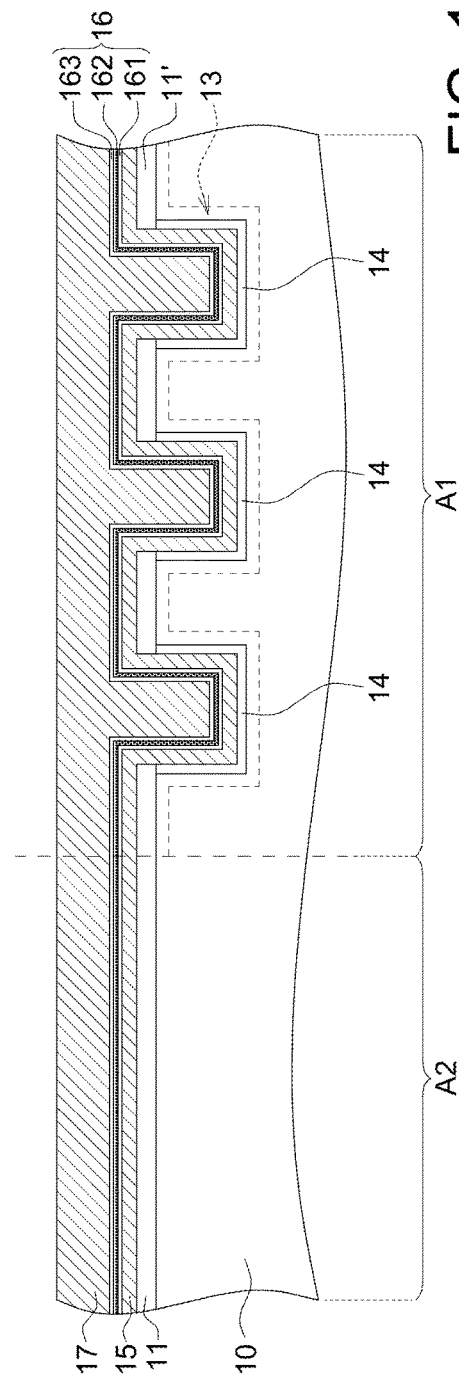

As shown in FIG. 1D, a first dielectric layer 14 is formed on the sidewalls and the bottom of each of the trenches 12, a first conductive layer 15 is formed on the first dielectric layer 14, a second dielectric layer 16 is formed on the first conductive layer 15, and a second conductive layer 17 formed on the second dielectric layer 16 and fully filling up the remained space between the second dielectric layer 16 (having a pleated shape) in each of the trenches 12. In one embodiment, the first dielectric layer 14 can be formed by growing a tunnel oxide layer. In one embodiment, the first conductive layer (ex: to form the floating gate subsequently) 15 and the second conductive layer (ex: to form the control gate subsequently) 17 are made of polysilicon. Also, the second dielectric layer 16 can be an oxide-nitride-oxide (ONO) multilayer. In one embodiment, the first dielectric layer 14 (ex: tunnel oxide) has a thickness of 80 Å-100 Å, the first conductive layer 15 can be deposited with a thickness of 400 Å-600 Å, the second dielectric layer 16 (ex: ONO) can be deposited with a thickness of 130 Å-160 Å, and the second conductive layer 17 can be deposited with a thickness of 600 Å-1000 Å. However, those numerical values of thicknesses are provided for illustration, not for the limitation. The thicknesses of related layers can be adjusted and chosen to determine the appropriate numerical values, so that the second conductive layer 17 can fully fill up the trenches 12 and be thick enough for the subsequent planarization process.

Then, as shown in FIG. 1E, the portions of the second conductive layer 17, the second dielectric layer 16, the first conductive layer 15 and the first dielectric layer 14 above the silicon substrate 10 are removed for planarization, so as to form a floating gate 15' (i.e. the patterned first conductive layer), the second dielectric layer 16' and a control gate 17' (i.e. the patterned second conductive layer) within each of the trenches 12. In one embodiment, this planarization step can be performed by chemical-mechanical polishing (CMP).

In FIG. 1E, the patterned sacrificial oxide layer 11' in the first area A1 and the blanket of the sacrificial oxide layer 11 in the second area A2 are exposed. In one embodiment, the top surface 17a of the control gate 17', the top surface 16a of the second dielectric layer 16' and the top surface 15a of the floating gate 15' could be +100 Å to −200 Å higher or lower than the top surface 10a of the silicon substrate 10. In one embodiment, the top surface 17a of the control gate 17', the top surface 16a of the second dielectric layer 16' and the top surface 15a of the floating gate 15' could be +100 Å to −100 Å higher or lower than the top surface 10a of the silicon substrate 10. Also, in one embodiment, the top surface 17a of the control gate 17', the top surface 16a of the second dielectric layer 16' and the top surface 15a of the floating gate 15' could be aligned with each other, and could be substantially aligned with or lower than a top surface 10a of the silicon substrate 10, depending on the practical requirements of the applications.

Subsequently, as shown in FIG. 1F, a third dielectric layer 18 is formed at least on the floating gate 15' and on the second dielectric layer 16', for the purpose of isolating the control gate 17' from the floating gate 15'. In one embodiment, re-oxidation is conducted to form a re-oxide layer as the third dielectric layer 18 on the control gate 17', the second dielectric layer 16' and the floating gate 15'. According to the embodiment, the control gate 17' is insulated from the floating gate 15' by the second dielectric layer 16' and the third dielectric layer 18.

Figure 1G:
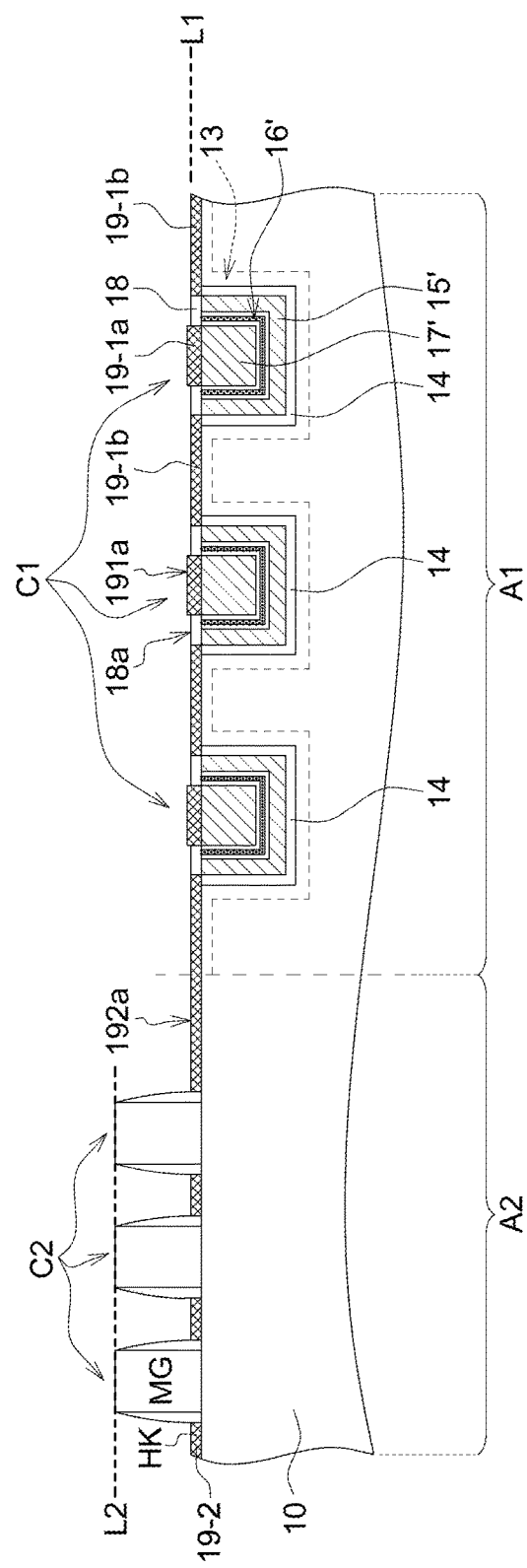

After forming the first cells C1 in the first area A1, the second cell formation in the second area A2 and the salicide formation are conducted. As shown in FIG. 1G, at least a second cell C2 (such as three second cells C2 in the drawing) in the second area A2 are formed on the substrate 10. In one embodiment, each of the second cells C2 comprises a metal gate MG formed on a high-k dielectric film HK above the substrate 10. Then, the entire structure is subjected to the salicide process, so as to form the salicide layers 19-1a and 19-1b respectively on the control gate 17' and the substrate 10 in the first area A1, and to form the salicide layer 19-2 on the substrate 10 in the second area A2.

If the salicide layer 19-1a in the first area A1 is considered as part of the control gate, the top surface 191a of the salicide layer 19-1a can be regarded as the top surface of the control gate 17' after salicide formation. Additionally, in one embodiment, the top surface 191a of the salicide layer 19-1a in the first area A1 (ex: the salicide layer 19-1a consuming part of the polysilicon of the control gate during salicide process) could be higher than the top surface 192a of the salicide layer 19-2 in the second area A2 (ex: the salicide layer 19-2 consuming part of the silicon substrate during salicide process).

Figure 2:
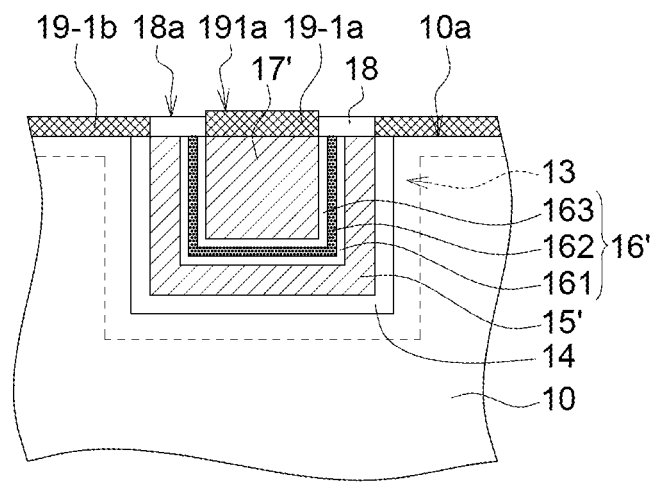
FIG. 2 is an enlarging view of a first cell according to one embodiment of the disclosure.
Figure 3:
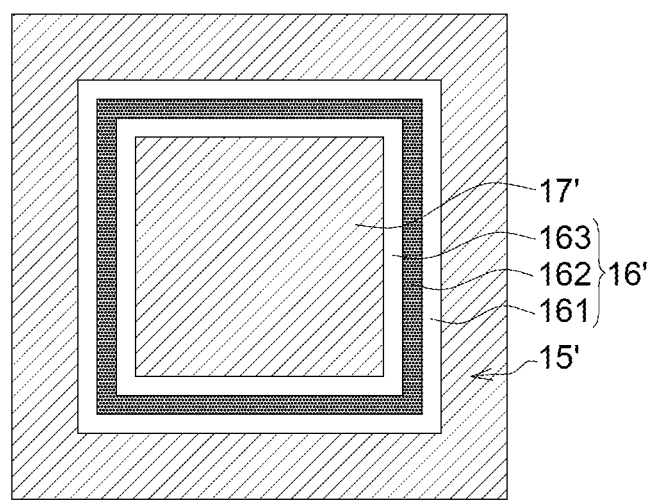
FIG. 3 is a top view of the control gate and floating gate of one first cell according to one embodiment of the disclosure.

FIG. 2 is an enlarging view of a first cell according to one embodiment of the disclosure. FIG. 3 is a top view of the control gate and floating gate of one first cell according to one embodiment of the disclosure. Please refer to FIG. 1G, FIG. 2 and FIG. 3. In FIG. 2, the first dielectric layer 14 in the trench 12 directly contacts the substrate 10 such as silicon substrate, since the first cell C1 of the embodiment is embedded in the substrate 10. Also, the space between the second dielectric layer 16' (having a pleated shape) is fully filled with the control gate 17', and the top surface 17a of the control gate 17' (or the top surface 191a of the salicide layer 19-1a) is parallel to the top surface 10a of the silicon substrate 10. Also, the top surface 18a of the third dielectric layer 18 is substantially aligned with the top surface 10a of the substrate 10. Furthermore, as shown in FIG. 3, the salicide layer 19-1a is formed on the control gate 17', wherein the floating gate 15' (with the third dielectric layer formed thereon) and the second dielectric layer 16' surround the control gate 17' while the third dielectric layer 18 surrounds the salicide layer 19-1a. Accordingly, the control gate 17' is insulated from the floating gate 15' by the second dielectric layer 16' and the third dielectric layer 18.

According to the disclosure, the second cells C2 are positioned on the substrate 10 while the first cells C1 are embedded in the substrate 10 (i.e. within the trenches 12 of the silicon substrate), which means the top surface (i.e. indicated by the dashed line L2 in FIG. 1G) of the metal gate MG of the second cell C2 is higher than the top surface (i.e.

indicated by the dashed line L1 in FIG. 1G) of the control gate of the first cell C1. When the manufacturing processes for forming the second cells (ex: with HKMG) in the second area (such as removing dummy poly, filling metal material followed by polishing procedure) are performed, the control gates of the first cells C1 are not damaged since the embodied first cells C1 are constructed under the top surface 10a of the substrate 10.

Figure 4:
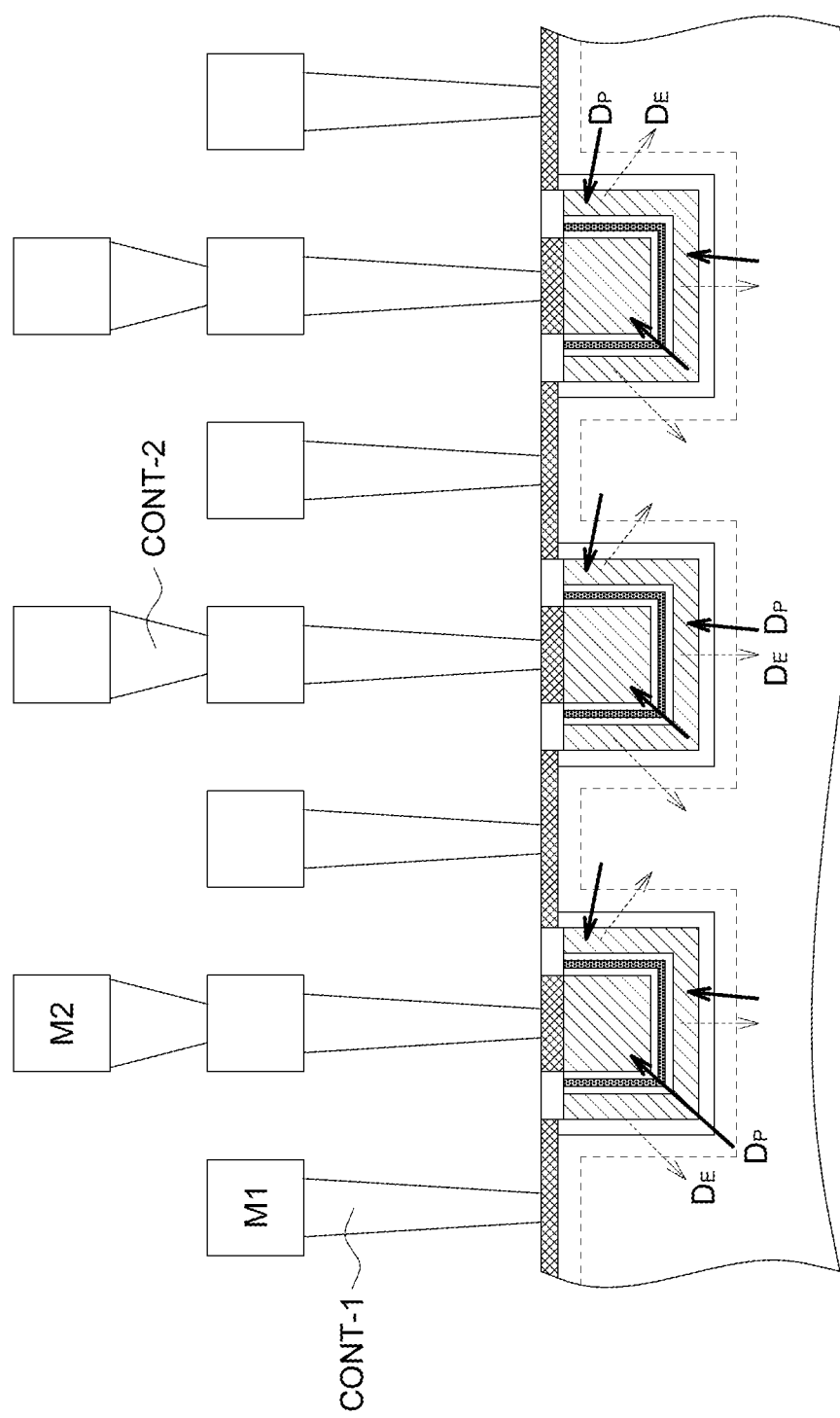
FIG. 4 simply illustrates formation of contacts and metal connections in the flash area according to one embodiment of the disclosure.

After formations of the second cells C2 in the second area A2 and the first cells C1 in the first area A1, relative contacts and metal connections can be formed subsequently. FIG. 4 simply illustrates formation of contacts and metal connections in the flash area according to one embodiment of the disclosure. As shown in FIG. 4, the first metal layer M1 is connected to the salicide layers 19-1a and 19-1b through the first contacts CONT-1, and the second metal layer M2 is connected to the first metal layer M1 through the second contacts CONT-2. In the embodiment, this cell structure in the three-dimensional trench enables the program operation of the first cell (ex: flash memory cell) by FN with three sides and the erase operation of the first cell by FN with three sides, thereby increasing the coupling ratio of the first cell. In FIG. 4, the arrows $D_P$ denote the programming directions, and the arrows $D_E$ denote the erasing directions.

According to the aforementioned descriptions, a semiconductor device can be manufactured for forming the gates with completely profiles in the different regions of the substrate. For example, the manufacturing processes for forming the second cells (ex: logic cells) in the second area (such as removing dummy poly, filling metal material followed by polishing procedure) cause no damage to the gates of the first cells since the first cells C1 (ex: flash memory cells) of the embodiment have been constructed under the surface of the substrate. Thus, the proposed structure and method of the present embodiments provide a way for effectively preventing the gates from damage (ex: the control gate of the flash memory cell) no matter what gate height difference between the first cells and second cells in different areas of the substrate. Additionally, besides complete gate profile and sufficient gate height of the cells, the embodied design is compatible with the current fabrication process of the flash memory devices, which is suitable for mass production.

Other embodiments with different configurations of known elements in the logic devices or flash devices can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a silicon substrate having a first area and a second area;
   at least a first cell positioned in the first area and formed in a trench of the silicon substrate, and the first cell comprising:
   a first dielectric layer formed on sidewalls and a bottom of the trench;
   a floating gate formed on the first dielectric layer and embedded in the trench;
   a second dielectric layer formed on the floating gate and embedded in the trench; and
   a control gate formed on the second dielectric layer and embedded in the trench, wherein the control gate is separated from the floating gate by the second dielectric layer; and
   at least a second cell positioned in the second area and formed on the silicon substrate;
   wherein the second cell comprises a metal gate formed above the silicon substrate, and a top surface of the metal gate of the second cell is higher than a top surface of the control gate of the first cell.

2. The semiconductor device according to claim 1, wherein the first dielectric layer in the trench directly contacts the silicon substrate.

3. The semiconductor device according to claim 1, wherein a space between the second dielectric layer with a pleated shape is fully filled with the control gate, and a top surface of the control gate is parallel to a top surface of the silicon substrate.

4. The semiconductor device according to claim 1, wherein a top surface of the control gate is substantially aligned with a top surface of the silicon substrate.

5. The semiconductor device according to claim 1, wherein top surfaces of the floating gate and the second dielectric layer in the trench are parallel to a top surface of the silicon substrate.

6. The semiconductor device according to claim 1, wherein top surfaces of the floating gate and the second dielectric layer are lower than or substantially aligned with a top surface of the silicon substrate.

7. The semiconductor device according to claim 1, wherein the first cell further comprises a third dielectric layer on the floating gate and the second dielectric layer, wherein the control gate is insulated from the floating gate by the second dielectric layer and the third dielectric layer.

8. The semiconductor device according to claim 7, wherein a top surface of the third dielectric layer is substantially aligned with a top surface of the silicon substrate.

9. The semiconductor device according to claim 7, wherein a salicide layer is formed on the control gate, wherein the floating gate and the second dielectric layer surround the control gate while the third dielectric layer surrounds the salicide layer.

10. A method for manufacturing a semiconductor device, comprising:
    providing a silicon substrate having a first area and a second area;
    forming at least a first cell in the first area and the first cell being embedding in a trench of the silicon substrate, the first cell comprising:
    a first dielectric layer formed on sidewalls and a bottom of the trench;
    a floating gate formed on the first dielectric layer and embedded in the trench;
    a second dielectric layer formed on the floating gate and embedded in the trench; and a control gate formed on the second dielectric layer and embedded in the trench, wherein the control gate is separated from the floating gate by the second dielectric layer; and forming at least a second cell in the second area, and the second cell positioned on the silicon substrate;

wherein the second cell in the second area is formed after forming the first cell, and the second cell comprises a metal gate formed above the silicon substrate, and a top surface of the metal gate of the second cell is higher than a top surface of the control gate of the first cell.

11. The method according to claim 10, wherein a top surface of the control gate is substantially aligned with a top surface of the silicon substrate.

12. The method according to claim 10, wherein the step of forming the first cell in the first area comprises:

forming the trench in the silicon substrate;

growing the first dielectric layer on the sidewalls and the bottom of the trench;

depositing a first conductive layer on the first dielectric layer;

forming the second dielectric layer on the first conductive layer;

depositing a second conductive layer on the second dielectric layer, wherein the second conductive layer fully fills space between the second dielectric layer having a pleated shape.

13. The method according to claim 12, further comprising:

removing portions of the second conductive layer, the second dielectric layer, the first conductive layer and the first dielectric layer above the silicon substrate, so as to form the first dielectric layer, the floating gate, the second dielectric layer and the control gate within the trench.

14. The method according to claim 13, wherein the step of forming the first cell at the first area further comprises:

forming a third dielectric layer at least on the floating gate and the second dielectric layer, wherein the control gate is insulated from the floating gate by the second dielectric layer and the third dielectric layer.

15. The method according to claim 14, wherein a salicide layer is formed on the control gate, wherein the floating gate and the second dielectric layer surround the control gate while the third dielectric layer surrounds the salicide layer.

16. The method according to claim 14, wherein a top surface of the third dielectric layer is substantially aligned with a top surface of the silicon substrate.

* * * * *